(12) United States Patent
Cui et al.

(10) Patent No.: US 11,513,647 B2
(45) Date of Patent: Nov. 29, 2022

(54) DISPLAY PANEL AND METHOD FOR MANUFACTURING THE SAME, DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Guoyi Cui, Beijing (CN); Tao Gao, Beijing (CN); Yulin Wang, Beijing (CN); Rui Hou, Beijing (CN); Yinbo Xian, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/245,134

(22) Filed: Apr. 30, 2021

(65) Prior Publication Data
US 2022/0035485 A1 Feb. 3, 2022

(30) Foreign Application Priority Data
Jul. 30, 2020 (CN) .......................... 202010748632.1

(51) Int. Cl.
*G06F 3/044* (2006.01)
*H01L 27/32* (2006.01)

(52) U.S. Cl.
CPC .......... *G06F 3/0445* (2019.05); *H01L 27/323* (2013.01); *G06F 2203/04103* (2013.01)

(58) Field of Classification Search
CPC .......... H01L 27/323; G06F 2203/04103; G06F 3/0445
See application file for complete search history.

(56) References Cited

U.S. PATENT DOCUMENTS

2018/0053810 A1* 2/2018 Jin .................... G06F 3/0412
2020/0127220 A1* 4/2020 Kim .................. H01L 51/5012

* cited by examiner

*Primary Examiner* — Afroza Chowdhury
(74) *Attorney, Agent, or Firm* — Houtteman Law LLC (57) ABSTRACT

A display panel, a method for manufacturing the same and a display device are provided. The display panel includes a substrate and a packaging layer. An edge of a first side of the packaging layer has a first slope. Touch lines are disposed on a side of the packaging layer away from the substrate, an extending direction of at least a portion of the touch lines is crossed with an extending direction of the edge of the packaging layer with the first slope. The touch lines include first lines, second lines and a first insulating layer. The second lines are electrically coupled to the first lines through vias in the first insulating layer. An orthographic projection of at least a portion of the first lines on the substrate is not overlapped with an orthographic projection of a portion of the packaging layer with the first slope on the substrate.

14 Claims, 8 Drawing Sheets

DISPLAY PANEL AND METHOD FOR MANUFACTURING THE SAME, DISPLAY DEVICE

CROSS REFERENCE TO RELATED APPLICATIONS

The present application claims priority to Chinese patent application No. 202010748632.1, filed on Jul. 30, 2020, the contents of which are incorporated herein by reference in their entirety.

TECHNICAL FIELD

The present disclosure relates to the field of display, and particularly relates to a display panel, a method for manufacturing a display panel and a display device.

BACKGROUND

Generally, in a process of manufacturing a display panel, after film layers of a light emitting device are manufactured, a packaging layer is manufactured on the light emitting device to package a display region of the display panel, and then touch lines are manufactured on the packaging layer, where the touch lines include a plurality of first lines, a plurality of second lines, and an insulating layer between the first lines and the second lines, and the first lines may be closer to the packaging layer than the second lines. In a process of manufacturing the first lines, since the packaging layer has a relatively steep slope at an edge thereof, a material of the first lines may be left at a position of the edge where the slope is relatively steep, which may cause a short circuit between adjacent first lines.

SUMMARY

An embodiment of the present disclosure provides a display panel, including:
a substrate;
a packaging layer disposed on the substrate, and an edge of a first side of the packaging layer is provided with a first slope;
touch lines disposed on a side, away from the substrate, of the packaging layer, and an extending direction of at least a portion of the touch lines is crossed with an extending direction of the edge, with the first slope, of the packaging layer;
the touch lines include a plurality of first lines, a plurality of second lines and a first insulating layer, the plurality of first lines and the plurality of second lines are respectively disposed on two opposite sides of the first insulating layer, and the plurality of second lines are disposed on the side, away from the substrate, of the first insulating layer,
the second lines are electrically coupled to the first lines through vias in the first insulating layer, an orthographic projection of at least a portion of the first lines on the substrate is not overlapped with an orthographic projection of a portion of the packaging layer with the first slope on the substrate.

In some implementations, in the portion of the first lines of which the orthogonal projection on the substrate does not overlap with the orthogonal projection of the portion of the packaging layer with the first slope on the substrate, each of the first lines is divided into a first part and a second part, the first part and the second part are respectively located on two sides of the first slope;

the first insulating layer has a first via and a second via therein, and the first via and the second via are respectively located on the two sides of the first slope, the first part is electrically coupled to the second line corresponding thereto through the first via; the second part is electrically coupled to the second line corresponding thereto through the second via.

In some implementations, a surface of a side of the first insulating layer away from the substrate is formed with a second slope at a position corresponding to the first slope, a gradient of the second slope is smaller than that of the first slope, In some implementations, an angle between a slope surface of the second slope and a direction parallel to the substrate is greater than 0° and less than or equal to about 50°.

In some implementations, an angle between a slope surface of the first slope of the packaging layer and the direction parallel to the substrate is greater than about 50° and less than 90°.

In some implementations, the first insulating layer is an organic insulating layer.

In some implementations, the display panel further includes: a second insulating layer disposed between the packaging layer and the touch lines and covering the edge of the packaging layer with the first slope.

In some implementations, the packaging layer includes inorganic layers and an organic layer that are stacked alternatively, where both an outermost side of the packaging layer proximal to the substrate and an outermost side of the packaging layer proximal to the touch lines are provided with the inorganic layers; a coverage area of the organic layer in the packaging layer is smaller than that of each of the inorganic layers, and edges of first sides of the inorganic layers are stacked to form the first slope.

In some implementations, organic layers and inorganic layers are alternatively stacked between the outermost side of the packaging layer proximal to the substrate and the outermost side of the packaging layer proximal to the touch lines.

In some implementations, the packaging layer includes a first inorganic layer, a first organic layer, and a second inorganic layer, the first inorganic layer and the second inorganic layer are respectively disposed on two opposite sides of the first organic layer, and the second inorganic layer is disposed on the side of the first organic layer away from the substrate, a coverage area of the first organic layer is smaller than that of the first inorganic layer and that of the second inorganic layer, and edges of first sides of the first inorganic layer and the second inorganic layer are stacked to form the first slope.

An embodiment of the present disclosure further provides a method for manufacturing a display panel, including:
manufacturing a substrate;
manufacturing a packaging layer on the substrate, and forming a first slope at an edge of a first side of the packaging layer;
manufacturing touch lines on a side of the packaging layer away from the substrate, so that an extending direction of at least a portion of the touch lines is crossed with an extending direction of the edge of the packaging layer with the first slope;
the manufacturing the touch lines on the side of the packaging layer away from the substrate includes:
manufacturing a plurality of first lines, so that an orthographic projection of at least a portion of the first lines on the substrate is not overlapped with an orthographic projection of a portion of the packaging layer with the first slope on the substrate;

manufacturing a first insulating layer on a side of the first lines away from the substrate, including manufacturing vias in the first insulating layer, so that a plurality of second lines to be manufactured are coupled to the first lines through the vias in the first insulating layer;

manufacturing the plurality of second lines on a side of the first insulating layer away from the substrate.

In some implementations, the manufacturing the plurality of first lines includes:

manufacturing the plurality of first lines on the side of the packaging layer away from the substrate;

etching and removing a portion of each first line corresponding to a position of the first slope so as to divide the first line into a first part and a second part which are respectively positioned at two sides of the first slope, where orthographic projections of the first part and the second part on the substrate are not overlapped with an orthographic projection of a portion of the packaging layer with the first slope on the substrate.

In some implementations, the manufacturing the first insulating layer on the side of the first lines away from the substrate includes:

forming a second slope at a position of the first insulating layer corresponding to the first slope, where a gradient of the second slope is smaller than that of the first slope.

In some implementations, the packaging layer includes inorganic layers and an organic layer that are stacked alternatively, where an outermost side of the packaging layer proximal to the substrate and an outermost side of the packaging layer proximal to the touch lines are provided with the inorganic layers, a coverage area of the organic layer in the packaging layer is smaller than a coverage area of each of the inorganic layers, and the manufacturing the packaging layer on the substrate includes:

depositing the inorganic layer on the substrate;

manufacturing the organic layer and inorganic layers which are stacked alternatively on the inorganic layer;

removing a portion of the inorganic layers stacked beyond a preset edge of the packaging layer through a one-time process, so that edges of first sides of the inorganic layers are stacked to form the first slope.

In some implementations, the packaging layer includes a first inorganic layer, a first organic layer, and a second inorganic layer, and a coverage area of the first organic layer is smaller than that of the first inorganic layer and that of the second inorganic layer, and the manufacturing the packaging layer on the substrate includes:

depositing the first inorganic layer on the substrate;

manufacturing the first organic layer on a side of the first inorganic layer away from the substrate;

depositing the second inorganic layer on a side of the first organic layer away from the substrate;

removing a portion of the first inorganic layer and the second inorganic layer beyond the preset edge of the packaging layer through a one-time process, so that edges of first sides of the first inorganic layer and the second inorganic layer are stacked to form the first slope.

An embodiment of the present disclosure further provides a display device, including the display panel described above.

DESCRIPTION OF EMBODIMENTS

The embodiments of the present disclosure will be described more fully hereinafter with reference to the accompanying drawings, but the illustrated embodiments may be embodied in different forms and should not be construed as limiting. These embodiments are provided so that the present disclosure will be thorough and complete, and will fully convey the scope of the present disclosure to those skilled in the art.

The accompanying drawings, which are included to provide a further understanding of the embodiments of the present disclosure and are incorporated in and constitute a part of this specification, illustrate embodiments of the present disclosure together with the description but not to limit the present disclosure. Features and advantages of the embodiments of the present disclosure will become more readily apparent to those skilled in the art from the detailed description of exemplary embodiments that proceeds with reference to the accompanying drawings.

The embodiments of the present disclosure may be described with reference to plan and/or cross-sectional views by way of idealized schematic illustrations of the present disclosure. Accordingly, the example illustrations may be modified in accordance with manufacturing techniques and/or tolerances.

The embodiments of the present disclosure and the features of the embodiments may be combined with each other in any way without conflict.

Unless defined otherwise, technical terms or scientific terms used herein shall have the ordinary meaning as understood by one of ordinary skill in the art to which the present disclosure belongs. The use of "first", "second" and the like in the present disclosure is not intended to indicate any order, quantity, or importance, but rather is used to distinguish one element from another. Also, the use of the terms "a", "an" or "the" and similar referents do not denote a limitation of quantity, but rather denote the presence of at least one. The word "comprising" or "including" and the like means that the element or item preceding the word contains the element or item listed after the word and its equivalent, but does not exclude other elements or items. The term "coupled" or the like is not restricted to physical or mechanical connections, but may include electrical connections, whether direct or indirect. Positional relationship terms such as "on", "under" and the like are used only to indicate relative positional relationships, and when the absolute position of the object being described is changed, the relative positional relationships may be changed accordingly.

Unless otherwise defined, all terms (including technical terms and scientific terms) used in the present disclosure have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The embodiments of the present disclosure are not limited to the embodiments shown in the drawings, but include modifications of configurations formed based on a manufacturing process. Thus, the regions illustrated in the figures have schematic properties, and the shapes of the regions shown in the figures illustrate specific shapes of regions of elements, but are not limiting.

Figure 1:
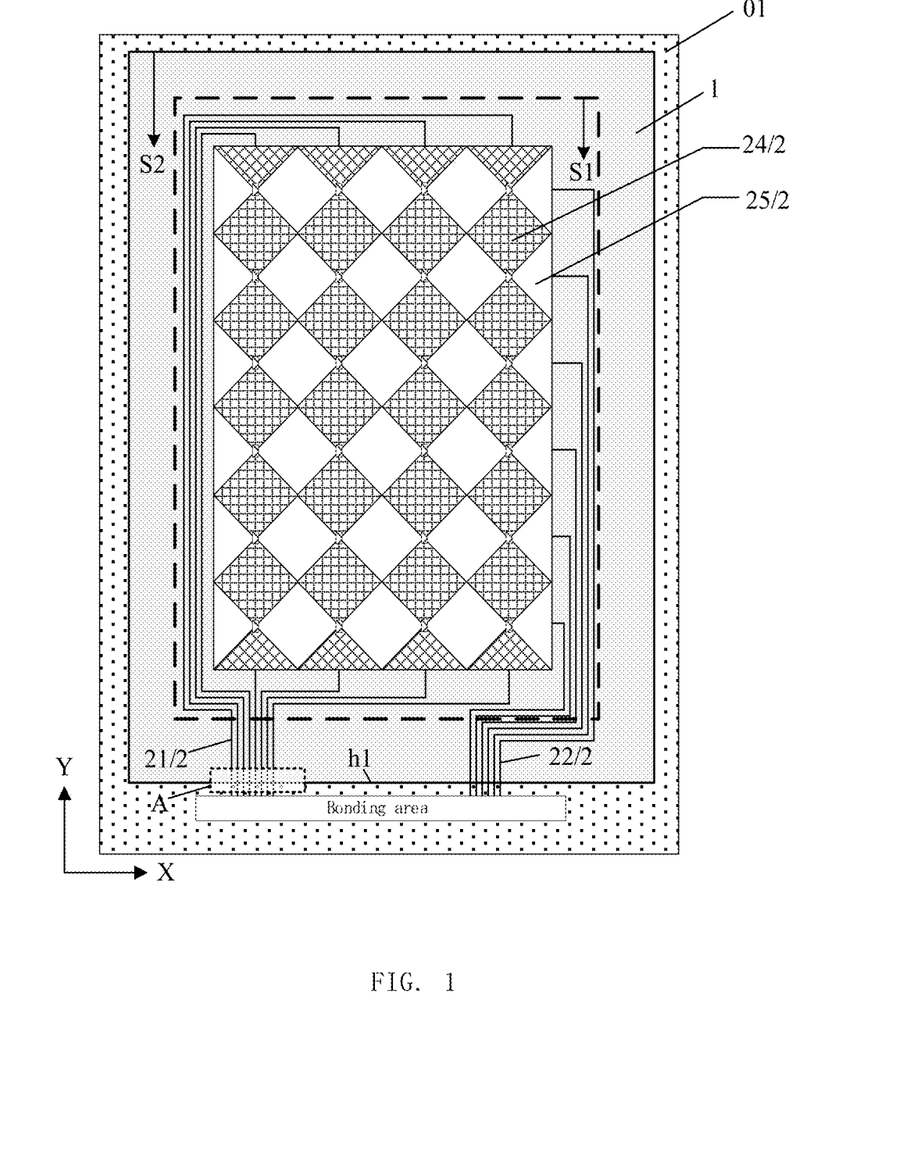
FIG. 1 is a schematic structural diagram (top view) of a display panel provided in an embodiment of the present disclosure.
Figure 2:
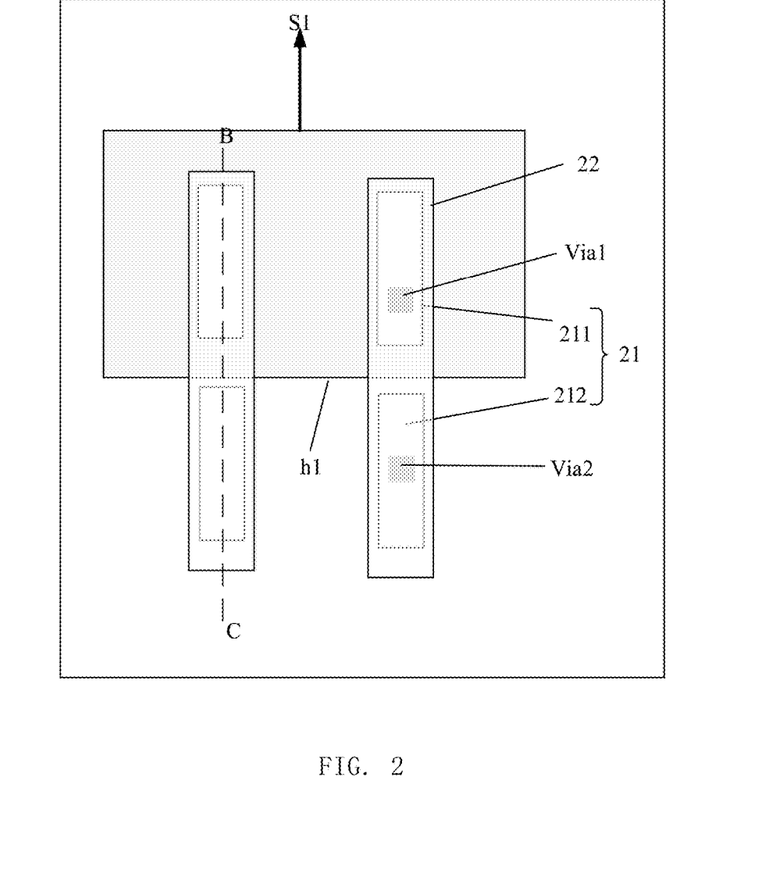
FIG. 2 is a partial schematic view of interior of dashed box A in FIG. 1.
Figure 3:
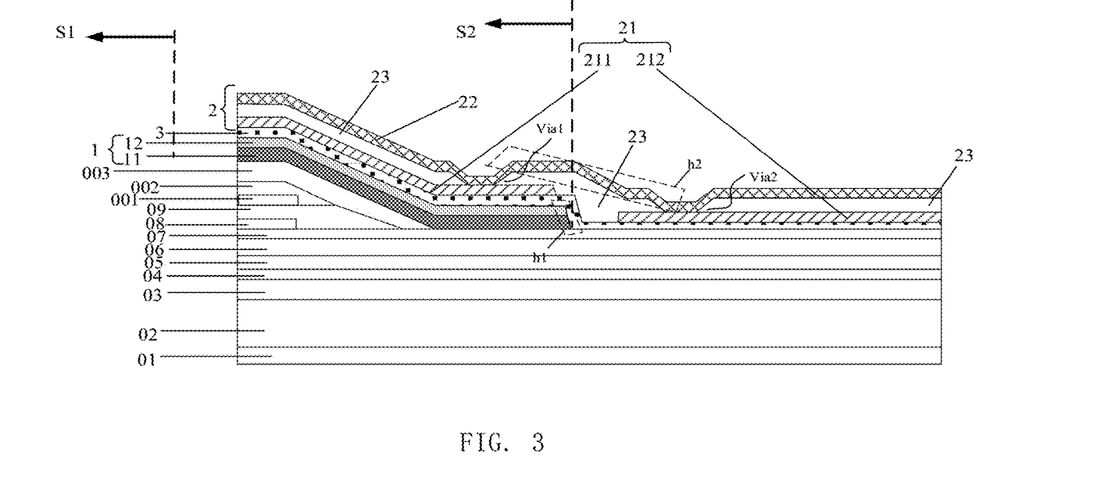
FIG. 3 is a view of layer structure taken along line B-C in FIG. 2.

As shown in FIG. 1, FIG. 2 and FIG. 3, FIG. 1 is a top view of a display panel according to an embodiment of the present disclosure, FIG. 2 is a partial schematic view of interior of a dashed box A in FIG. 1, FIG. 3 is a layer structure diagram taken along a line B-C in FIG. 2, for convenience of illustrating the structure, a layer structure between a substrate 01 and a packaging layer 1, and a first insulating layer 23 are omitted in the top view of FIG. 1, and in FIG. 3, a second line 22 is made transparent to show a structure of a first line 11 under the second line 22.

Referring to FIGS. 1, 2, and 3, an embodiment of the present disclosure provides a display panel including a display region S1 and a package region S2, where the package region S2 covers the display region S1, a bonding area is on a first side (e.g., a lower side in FIG. 1) of the package region S2, and the display panel has a first side frame on a side thereof proximal to the bonding area. The display panel includes a substrate 01, a display structure (not shown in the figure) may be disposed at a position, corresponding to the display region S1, of the substrate 01, the display structure may include a plurality of light emitting devices (not shown in the figure) which are arranged in an array, a packaging layer 1 is disposed on a side, away from the substrate 01, of the light emitting devices, the package layer 1 is arranged in the package region S2, the packaging layer 1 covers the display region S1 entirely, namely covers the display structure, and seals the light emitting devices in the display region S1 to prevent impurities such as water vapor and the like from entering the light emitting devices to affect light emitting performance of the light emitting devices.

Specifically, referring to FIG. 1 and FIG. 2, an edge of the packaging layer 1 proximal to the first side frame has a first slope h1, and the first slope h1 is a slope between an edge of the packaging layer 1 at a first side and a film layer under the packaging layer 1. Touch lines 2 are disposed on a side of the packaging layer 1 away from the substrate 01, an extending direction of at least a portion of the touch lines 2 crosses an extending direction of the edge (i.e., the edge at the first side) of the packaging layer 1 having the first slope h1, that is, the extending direction of the touch lines 2 is not parallel to the extending direction of the edge of the packaging layer 1 having the first slope h1, and at least a portion of the touch lines 2 extends to outside of the edge of the packaging layer 1 at the first side and passes over the first slope h1 at the edge of the first side.

It should be noted that the first side may be any side of the display panel, for example, the display panel is an approximately rectangular display panel, and includes a first side and a second side that are oppositely disposed and a third side and a fourth side that are oppositely disposed, where the first side may be a lower side, and the second side is an upper side. In the following, the first side is taken as the lower side (lower side in FIG. 1) of the display panel.

In some implementations, the touch lines 2 may include a plurality of first lines 21, a plurality of second lines 22 and a first insulating layer 23, the plurality of first lines 21 and the plurality of second lines 22 are respectively disposed on two opposite sides of the first insulating layer 23, and the plurality of second lines 22 are disposed on a side of the first insulating layer 23 away from the substrate 01. In the display region S1, a layer where the touch lines 2 are located may further include a first touch electrode 24 and a second touch electrode 25, and the first insulating layer 23 between the first touch electrode 24 and the second touch electrode 25, one of the first touch electrode 24 and the second touch electrode 25 may be a touch scan electrode for transmitting a driving signal, and the other may be a touch sense electrode for sensing a touch operation. Each of the first lines 21 is coupled to a column of first touch electrodes 24, and the first lines 21 extend to the bonding area along a first direction (e.g., Y direction in the figure), and the extending direction of the first lines 21 intersects with the edge of the packaging layer 1 having the first slope h1. Each of the second lines 22 is coupled to a row of second touch electrodes 25, and the second lines 22 extend along a first direction (e.g., Y direction in the figure) to the edge of the packaging layer 1 having the first slope h1, and extend to the bonding area after crossing the edge of the packaging layer 1. One of the first line 21 and the second line 22 is a touch signal line, and the other is a scan signal line, which is not limited herein. Referring to FIGS. 2 and 3, the second line 22 is electrically coupled to the first line 21 through vias (e.g., Via1 and Via2) in the first insulating layer 23. An orthographic projection of at least a portion of the first lines 21 on the substrate 01 does not overlap with an orthographic projection of a portion of the packaging layer 1 with the first slope h1 on the substrate 01. Since the orthographic projection of the potion of the first lines 21 on the substrate 01 is not overlapped with the orthographic projection of the portion of the packaging layer 1 with the first slope h1 on the substrate 01, the first lines 21 can be prevented from passing over the edge of the packaging layer 1 with the first slope h1, short circuit between different first lines 21 caused by the fact that materials of the first lines 21 are remained in an area where adjacent first lines 21 are located due to a slope can be avoided, and the second line 22 is coupled to the parts of the first line 21 on the two sides of the first slope h1 through the vias in the first insulating layer 23, so that signal transmission can be ensured, and reliability of a touch function can be improved.

It should be noted that, in an area near the edge of the packaging layer 1 having the first slope h1, orthographic projections of the first line 21 and the second line 22 on the substrate 01 may be overlapped or not.

In some implementations, as shown in FIGS. 2 and 3, in the plurality of first lines 21, an orthographic projection of at least a portion of the first lines 21 on the substrate 01 does not overlap with an orthographic projection of a portion of the packaging layer 1 having the first slope h1 on the substrate 01, in this portion of the first lines 21, each first line 21 may be divided into a first part 211 and a second part 212, the first part 211 and the second part 212 of the first line 21 are respectively located on two sides of the first slope h1 of the packaging layer 1, that is, the first line 21 is divided into two parts at a position of the packaging layer 1 having the first slope h1, the first part 211 is located on a side of the first slope h1 proximal to the display region S1, the second part 212 is located on a side of the first slope h1 away from the display region S1 and is located outside the package region S2, so as to prevent the first line 21 from passing over the first slope h1, and thus it is possible to prevent material of the first line 21 from remaining in an area, where an adjacent first line 21 is located, at the first slope h1 and causing the first lines 21 are shorted. Correspondingly, a first via Via1 and a second via Via2 are provided in the first insulating layer 23 of the touch lines 2, and the first via Via1 and the second via Via2 are respectively located at two sides of the first slope h1 of the packaging layer 1, for example, the first part 211 of the first line 21 is electrically coupled to the second line 22 corresponding to the first line 21 through the first via Via1 in the first insulating layer 23, and the second part 212 of the first line 21 is electrically coupled to the second line 22 corresponding to the first line 21 through the second via Via2 in the first insulating layer 23.

In some implementations, an angle between a slope surface of the first slope h1 of the packaging layer 1 and a direction parallel to the substrate 01 is in a range from about 50° to 90°, and the slope surface of the first slope h1 is a slope surface between an edge of a bottom surface of the first inorganic layer 11 in the packaging layer 1 proximal to the substrate 01 and an edge of a top surface of the second inorganic layer 12 away from the substrate 01.

In some implementations, a surface of the first insulating layer 23 on a side thereof away from the substrate 01 is formed with a second slope h2 at a position corresponding to the first slope h1 of the packaging layer 1, an angle between a slope surface of the second slope h2 and a direction parallel to the substrate 01 is in a range from 0° to about 50°, an end (e.g., a top end) of the second slope h2 is proximal to the first via Via1, and the other end (e.g., a bottom end) of the second slope h2 is proximal to the second via Via2. The slope surface of the second slope h2 may be irregular, and in such case, the slope surface of the second slope h2 is defined by a connecting line between a highest point and a lowest point of the slope surface of the second slope h2.

In some implementations, the first insulating layer 23 may be an organic insulating layer, and any organic material may be used for the first insulating layer 23, as long as the organic material used for the first insulating layer 23 has a transparent property and does not affect light emitting of the light emitting device.

In some implementations, as shown in FIG. 3, the display panel may further include a second insulating layer 3, the second insulating layer 3 is disposed between the packaging layer 1 and the touch lines 2, the second insulating layer 3 covers the packaging layer 1, and covers the edge of the packaging layer 1 having the first slope h1, so that a shape of the second insulating layer 3 at the edge of the packaging layer 1 having the first slope h1 fits the slope surface of the first slope h1. The second insulating layer 3 may serve as a touch substrate of the touch lines 2, the touch lines 2 are formed on the second insulating layer 3, the second insulating layer 3 may be made of an inorganic material, for example, silicon nitride (SiNx), and a specific method for manufacturing the second insulating layer 3 is not limited herein.

In some implementations, the packaging layer 1 includes inorganic layers and an organic layer which are overlapped alternatively, and the specific number of the organic layer and the inorganic layers is not limited, as long as the side of the packaging layer 1 proximal to the substrate 01 and the side of the packaging layer 1 proximal to the touch lines 2 are provided with the inorganic layers, that is, in the display panel shown in FIG. 3, both upper and lower outermost sides of the packaging layer 1 are provided with the inorganic layers, and any number of stacked layers may be included between the inorganic layers at the upper and lower outermost sides, as long as the inorganic layers at the outermost sides and the stacked layer therebetween are formed in a structure in which the inorganic layers and the organic layers are alternatively stacked (i.e., in a structure of inorganic layer-organic layer-inorganic layer-organic layer . . . . . . inorganic layer), and the number of stacked layers between the inorganic layers at the upper and lower outermost sides is not specifically limited herein. In the structure of the packaging layer 1, a coverage area of the organic layer is smaller than that of each inorganic layer, that is, referring to FIG. 1, the organic layer covers the display region S1 entirely, but the coverage area of the organic layer is smaller than that of the package region S2, and each inorganic layer covers the display region S1 and extends to a boundary of the package region S2, and edges of the inorganic layers proximal to the first side frame are stacked to form the first slope h1, so that only the inorganic layers are stacked at the boundary of the package region S2.

In some implementations, referring to FIG. 3, taking a case that the packaging layer 1 includes a first inorganic layer 11, a first organic layer (not shown in FIG. 3) and a second inorganic layer 12 as an example, the first inorganic layer 11 and the second inorganic layer 12 are respectively disposed on two sides of the first organic layer, and the second inorganic layer 12 is disposed on the side of the first inorganic layer 11 away from the substrate 01, that is, in the display region S1, the first inorganic layer 11 is provided on a side of the light emitting device away from the substrate 01, the first organic layer is provided on a side of the first inorganic layer 11 away from the substrate 01, the second inorganic layer 12 is provided on a side of the first organic layer away from the substrate 01, and a coverage area of the first organic layer is smaller than a coverage area of the first inorganic layer 11 and is also smaller than a coverage area of the second inorganic layer 12, only a layer structure diagram on a side of an edge of the first organic layer away from the display region S1 is shown in FIG. 3, that is, at the edge of the package region S2, the packaging layer 1 includes only the first inorganic layer 11 and the second inorganic layer 12, and edges of the first inorganic layer 11 and the second inorganic layer 12 proximal to the first side frame are stacked to form the first slope h1.

In some implementations, the first inorganic layer 11 and the second inorganic layer 12 may include any material, for example, the material of the first inorganic layer 11 may be silicon oxynitride, the material of the second inorganic layer 12 may be silicon oxide, and certainly, any other material or combination of materials may be used, which is not limited herein.

In some implementations, as shown in FIG. 3, the display panel may further include a second substrate 02 on the substrate 01, if the substrate 01 is a glass substrate, the second substrate 02 may be, for example, a polyimide (PI) substrate, a buffer layer 03 may be disposed on the second substrate 02, a first gate insulating layer 04 may be disposed on the buffer layer 03, a second gate insulating layer 05 may be disposed on the first gate insulating layer 04, an interlayer insulating layer 06 may be disposed on the second gate insulating layer 05, and a protection layer (PVX) 07 may be disposed on the interlayer insulating layer 06, it is known that, in the display region S1, a thin film transistor is disposed between the protection layer 07 and the buffer layer 03, with continuing reference to FIG. 3, a wiring layer 08 is provided on the protection layer 07, a planarization layer (PLN) 09 is provided on the wiring layer 08, a first electrode 001 is provided on the planarization layer 09, a pixel defining layer (PDL) 002 is provided on the first electrode 001, and it is known that, in the display region S1, the pixel defining layer 002 is located between pixel units in the display region S1, each of the pixel units is provided with a light emitting device (not shown in FIG. 3) therein, the light emitting device including the first electrode 001, a light emitting layer (not shown in FIG. 3) disposed on a side of the first electrode 001 away from the substrate 01, and a second electrode (not shown in FIG. 3) disposed on a side of the light emitting layer away from the substrate 01, and a spacer layer 003 is disposed on the pixel defining layer 002. Certainly, the layer structure of the display panel may be of any other type, and FIG. 3 only shows an example of the layer structure of the display panel.

Figure 4:
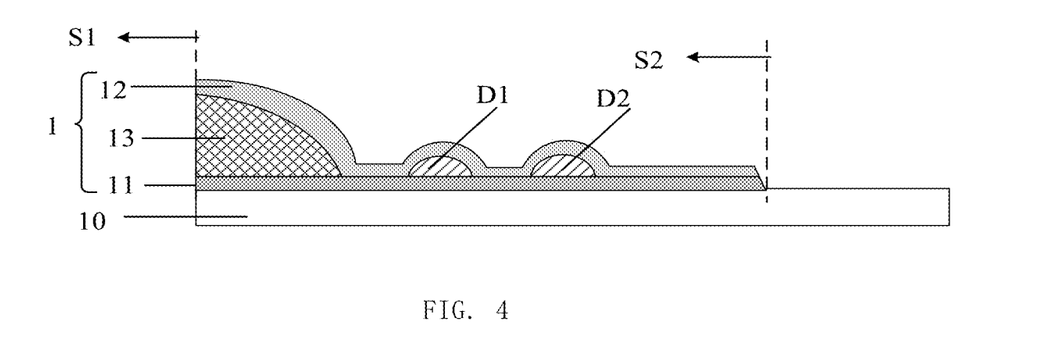
FIG. 4 is a schematic diagram of a film structure of a packaging layer in a display panel according to an embodiment of the present disclosure.

As shown in FIG. 4, taking a case that the packaging layer 1 includes the first inorganic layer 11, the second inorganic layer 12, and the first organic layer 13 as an example, the packaging layer 1 is disposed on a film layer 10, the film layer 10 may include the substrate 01, a buffer layer, a gate insulating layer, a first electrode layer of a light emitting device disposed on the substrate 01, and the like, and a specific structure of the film layer 10 may be changed according to a structure of the display panel. The first organic layer 13 may be an inkjet printed organic layer, and an orthographic projection of the first organic layer 13 on the film layer 10 (or the substrate 01) covers the display region S1 entirely but is smaller than orthographic projections of the first inorganic layer 11 and the second inorganic layer 12 on the film layer 10 (or the substrate 01). Between edges of the first inorganic layer 11 and the second inorganic layer 12 (i.e., the boundary of the package region S2) and the edge of the first organic layer 13, there is at least one barrier structure for preventing the material of the first organic layer 13 from overflowing outside the boundary of the package region S2 when the first organic layer 13 is inkjet printed. FIG. 4 shows the display panel including the first barrier structure D1 and the second barrier structure D2 as an example, the first barrier structure D1 and the second barrier structure D2 are disposed between the first inorganic layer 11 and the second inorganic layer 12, and the first barrier structure D1 is closer to the display region S1 than the second barrier structure D2. The boundary of the package region S2 (i.e., the boundary of the first inorganic layer 11 and the second inorganic layer 12 which are stacked) is disposed proximal to an outermost barrier structure (e.g., the second barrier structure D2).

Figure 5:
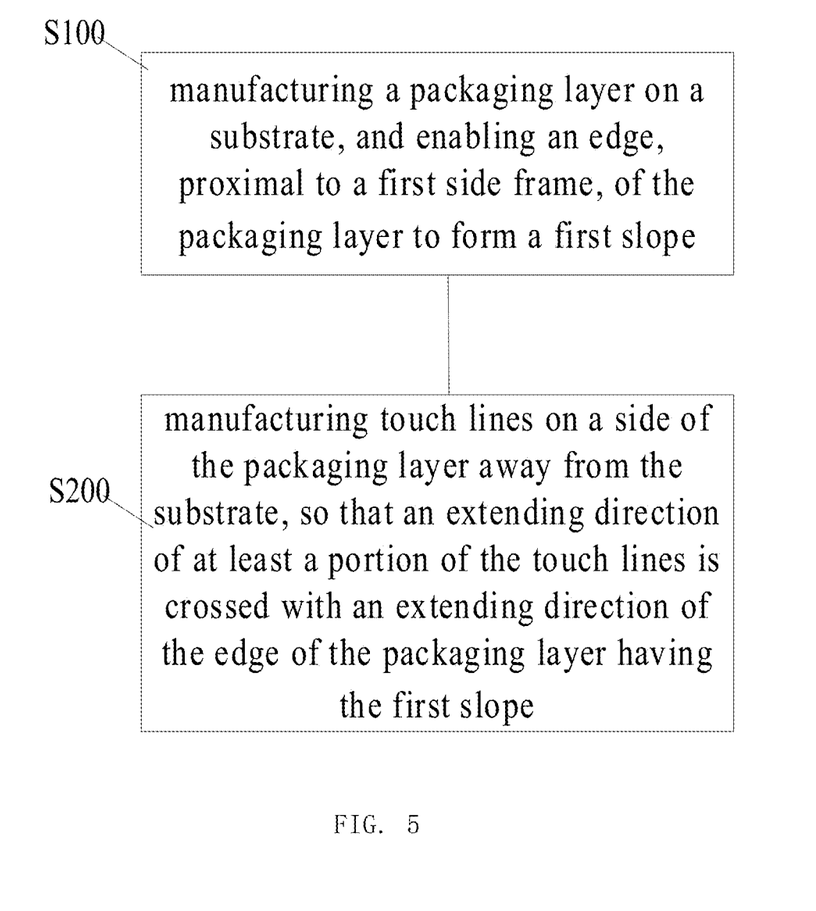
FIG. 5 is a flowchart of a method for manufacturing a display panel according to an embodiment of the present disclosure.

As shown in FIG. 5, an embodiment of the present disclosure further provides a method for manufacturing a display panel, where after a substrate 01 and other film layers (for example, a display structure) above the substrate 01 are manufactured, the method includes following steps S100 and S200.

S100, manufacturing a packaging layer 1 on the substrate 01, and enabling an edge, proximal to the first side frame, of the packaging layer 1 to form a first slope h1.

In some implementations, the packaging layer 1 includes inorganic layers and an organic layer that are stacked alternatively, and the number of the inorganic layers and the organic layer may be set as required, as long as an outermost side of the packaging layer 1 proximal to the substrate 01 and an outermost side of the packaging layer 1 proximal to the touch lines 2 are provided with the inorganic layers. As described above, a coverage area of the organic layer in the packaging layer 1 is smaller than a coverage area of each inorganic layer. Thus, S100 may specifically include:

depositing the inorganic layer on the substrate 01;

manufacturing organic layers and inorganic layers which are stacked alternatively on the inorganic layer;

removing a portion of the inorganic layers stacked beyond a preset edge of the packaging layer 1 (i.e., a portion beyond an edge of the package region S2) through a one-time process, so that edges of the inorganic layers proximal to a first side (e.g., lower side) frame of the display panel are stacked to form the first slope h1.

In a case where the outermost side of the packaging layer 1 proximal to the substrate 01 and the outermost side of the packaging layer 1 proximal to the touch lines 2 are provided with the inorganic layers, that is, in a case where both upper and lower outermost sides of the packaging layer 1 are provided with the inorganic layers, any number of stacked layers may be included between the inorganic layers at the upper and lower outermost sides, as long as the inorganic layers at the upper and lower outermost sides and the stacked layer therebetween are arranged in a structure in which inorganic layers and organic layers are stacked alternatively (i.e., in a structure of inorganic layer-organic layer-inorganic layer-organic layer . . . . . . inorganic layer), and the number of stacked layers between the inorganic layers at the upper and lower outermost sides is not particularly limited herein.

Figure 6:
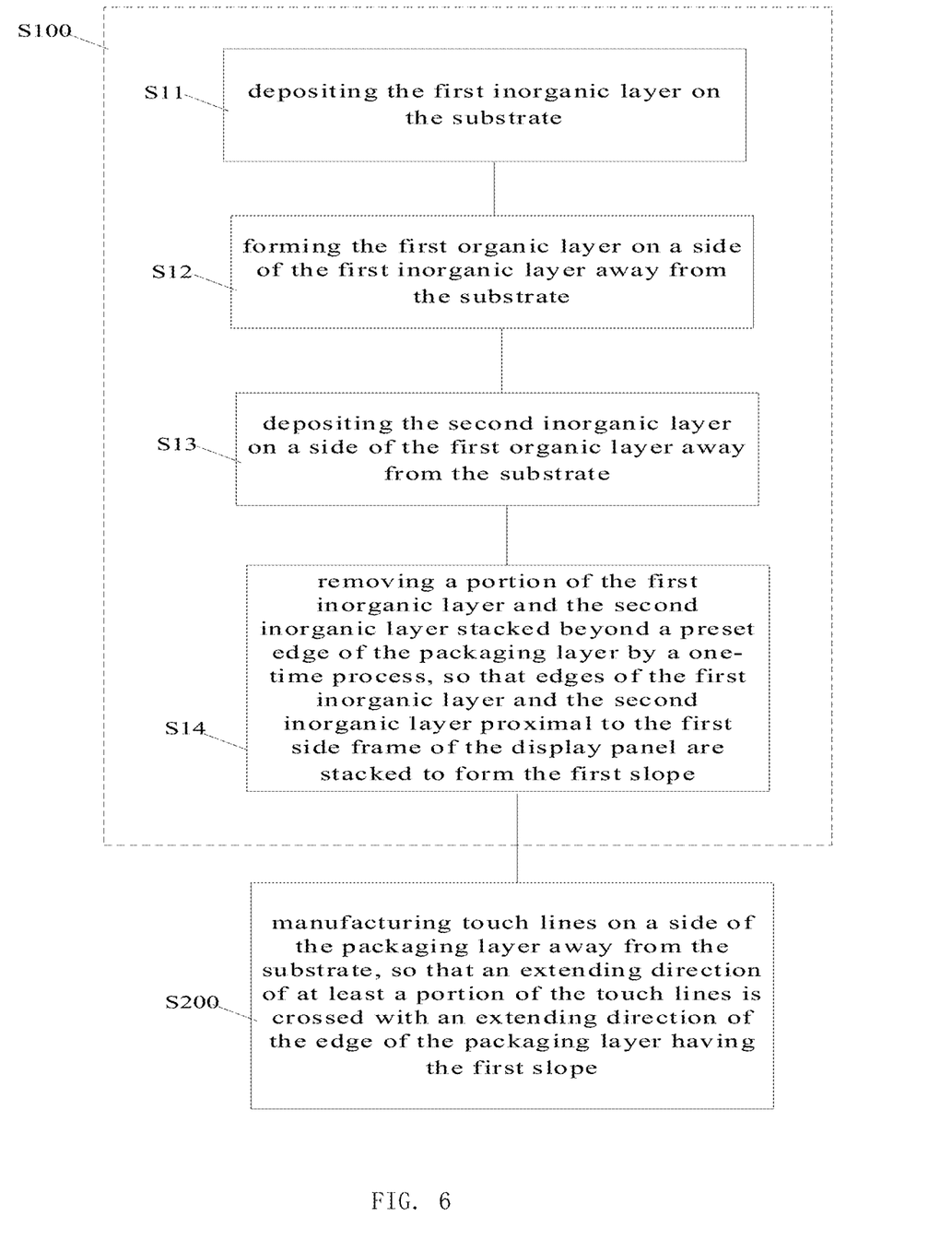
FIG. 6 is another flowchart of a method for manufacturing a display panel according to an embodiment of the present disclosure.
Figure 7:
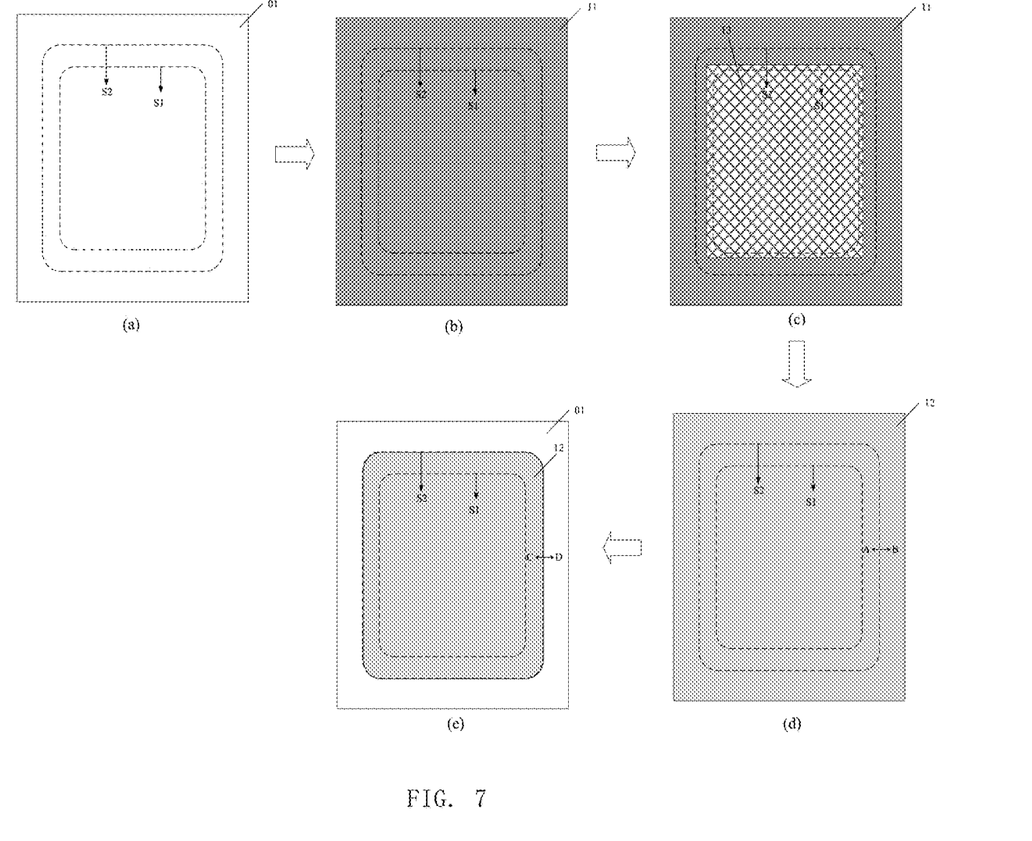
FIG. 7 is a diagram (plan view) illustrating a process flow for manufacturing a packaging layer in a method for manufacturing a display panel according to an embodiment of the present disclosure.
Figure 8:
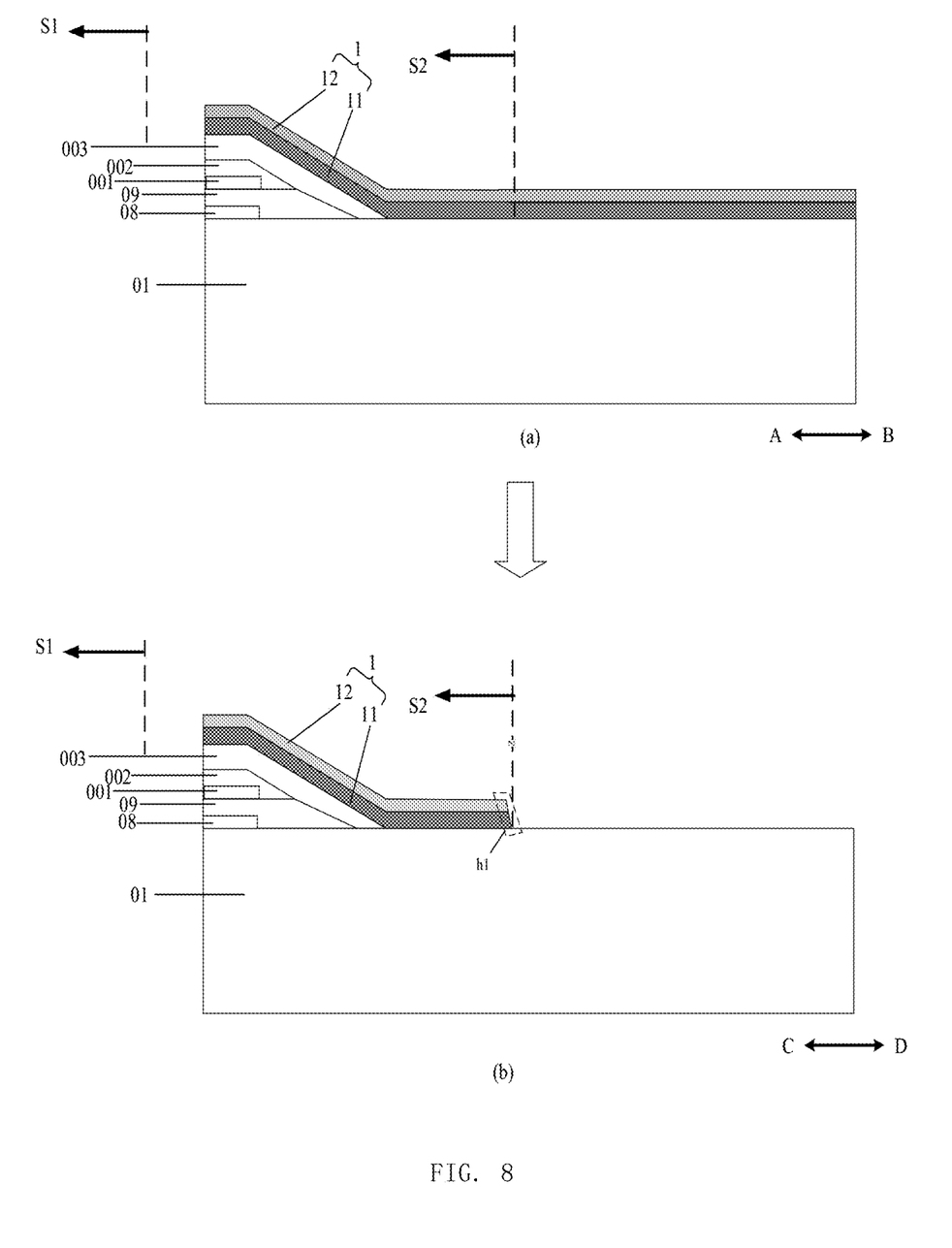
FIG. 8 is a diagram (layer structure diagram) illustrating a process flow for manufacturing a packaging layer in a method for manufacturing a display panel according to an embodiment of the present disclosure.

In some implementations, taking a case that the packaging layer 1 includes a first inorganic layer 11, a first organic layer and a second inorganic layer 12 as an example, a coverage area of the first organic layer is smaller than a coverage area of the first inorganic layer 11 and is also smaller than a coverage area of the second inorganic layer 12. Thus, as shown in FIGS. 6 to 8, S100 may specifically include following S11 to S14. FIG. 6 is a flowchart of a method for manufacturing a display panel according to an embodiment of the present disclosure, FIG. 7 is a flowchart of a process for manufacturing the packaging layer 1, (a) of FIG. 8 is a cross-sectional view of (d) of FIG. 7 taken along a line A-B, and (b) of FIG. 8 is a cross-sectional view of (e) of FIG. 7 taken along a line C-D.

S11, depositing the first inorganic layer 11 on the substrate 01.

Specifically, as shown by (a) and (b) in FIG. 7, the first inorganic layer 11 may be deposited on the substrate 01 such that the first inorganic layer 11 covers the substrate 01 entirely. The material of the first inorganic layer 11 may be, for example, silicon oxynitride, and a layer of silicon oxynitride may be deposited on the substrate 01 by a Chemical Vapor Deposition (CVD) process to form the first inorganic layer 11.

In FIGS. 7 and 8, for convenience of description, only the substrate 01 is shown below the packaging layer 1, and in fact, a plurality of film layers, such as a gate insulating layer, a first electrode layer of a light emitting device, and the like, may be further included between the substrate 01 and the packaging layer 1, and may be specifically adjusted according to a film layer structure of the display panel, which is not specifically limited herein.

S12, forming the first organic layer 13 on a side of the first inorganic layer 11 away from the substrate 01.

As shown by (b) and (c) in FIG. 7, the first organic layer 13 may be formed on a side of the first inorganic layer 11 away from the substrate 01, and the first organic layer 13 covers the display region S1 entirely, but a coverage area of the first organic layer 13 is within the package region S2.

In some implementations, the first organic layer 13 may be printed on the side of the first inorganic layer 11 away from the substrate 01 by an inkjet printing (IJP) process, and certainly, the first organic layer 13 may be manufactured by other processes, which are not limited herein.

S13, depositing the second inorganic layer 12 on a side of the first organic layer 13 away from the substrate 01.

As shown by (c) and (d) in FIG. 7, the second inorganic layer 12 may be deposited on the first inorganic layer 11 such that the second inorganic layer 12 covers the substrate 01 entirely. The material of the second inorganic layer 12 may be, for example, silicon oxide, and a layer of silicon oxide may be deposited on the first inorganic layer 11 by a CVD process to form the second inorganic layer 12.

S14, removing a portion of the first inorganic layer 11 and the second inorganic layer 12 stacked beyond a preset edge of the packaging layer 1 by a one-time process, so that edges of the first inorganic layer 11 and the second inorganic layer 12 proximal to the first side frame of the display panel are stacked to form the first slope h1.

Specifically, as shown by (d) and (e) in FIG. 7 and FIG. 8, the preset edge of the packaging layer 1 is the edge of the package region S2, as required, the edge of the packaging layer 1 may be preset at a position, outside the edge of the display region S1, with a preset distance from the edge of the display region S1, according to the preset edge of the packaging layer 1, a portion of the first inorganic layer 11 and the second inorganic layer 12 (as shown by (a) in FIG. 8) covering the substrate 01, which exceeds the preset edge (i.e., the boundary of the package region S2) of the packaging layer 1 is removed by using a mask through an etching process, and the portion of the first inorganic layer 11 and the second inorganic layer 12, which exceeds the present edge of the packaging layer 1, is removed by a one-time etching process (as shown by (b) in FIG. 8), so that the first inorganic layer 11 and the second inorganic layer 12 are within the package region S2. An angle between a slope surface of the first slope h1 and a direction parallel to the substrate 01, i.e., a gradient of the first slope h1, may be controlled by adjusting parameters of the mask. Compared with that etching and removing processes are performed on the inorganic layer through a mask every time when the inorganic layer is deposited in the related art, in the method for manufacturing the display panel according to the embodiment of the present disclosure, since the portion of the inorganic layers of the packaging layer 1, which exceeds the preset edge of the packaging layer 1, is removed after all stacked layers of the packaging layer 1 are deposited, multiple etching processes can be omitted, and the packaging layer 1 can be formed by using only one mask. When the mask is used for etching, the mask may leave a shadow on the film layer (for example, the first inorganic layer 11 and the second inorganic layer 12) to be etched, and the mask needs to be aligned and whitened, and the like, thus a certain error may be generated in etching range, so that a range of the film layer left by etching is slightly greater than a preset range. In the embodiment of the present disclosure, only one mask is used for etching to form the packaging layer 1, and thus an error of etching is reduced significantly, and a distance between the edge of the packaging layer 1 and the edge of the display region S1 is reduced, which facilitates to achieve a narrow bezel of the display panel.

S200, manufacturing touch lines 2 on a side of the packaging layer 1 away from the substrate 01, so that an extending direction of at least a portion of the touch lines 2 is crossed with an extending direction of the edge of the packaging layer 1 having the first slope h1.

Specifically, as shown in FIG. 1, in the embodiment, the edge of the packaging layer 1 having the first slope h1 is a lower edge of the packaging layer 1, the lower edge of the packaging layer 1 extends along a second direction (e.g., a row direction), the touch lines 2 (including the first lines 21 and the second lines 22) extend along the first direction (e.g., a column direction) at the lower edge of the packaging layer 1, and at least a portion of the second lines 22 in the touch lines 2 crosses the lower edge of the packaging layer 1.

It should be noted that, the first direction and the second direction may be any directions, as long as the first direction is not parallel to the second direction, for example, in the display region S1, the first direction may be a column direction (for example, Y direction in FIG. 1), and the second direction may be a row direction (for example, X direction in FIG. 1), which is not limited herein.

Figure 9:
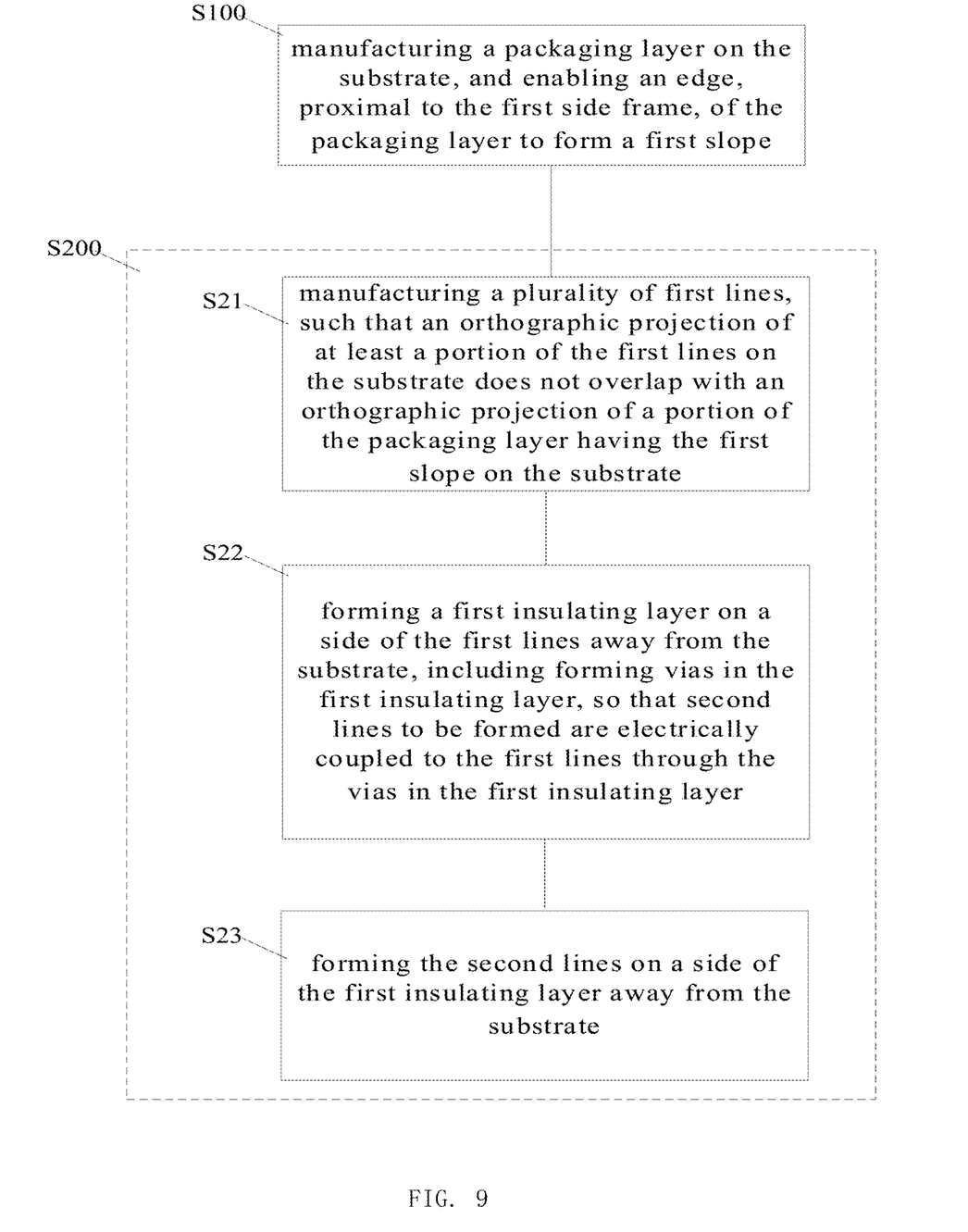
FIG. 9 is further another flowchart of a method for manufacturing a display panel according to an embodiment of the present disclosure.

In some implementations, as shown in FIG. 9, S200 may specifically include following S21 to S23.

S21, manufacturing a plurality of first lines 21, such that an orthographic projection of at least a portion of the first lines 21 on the substrate 01 does not overlap with an orthographic projection of a portion of the packaging layer 1 having the first slope h1 on the substrate 01.

Figure 10:
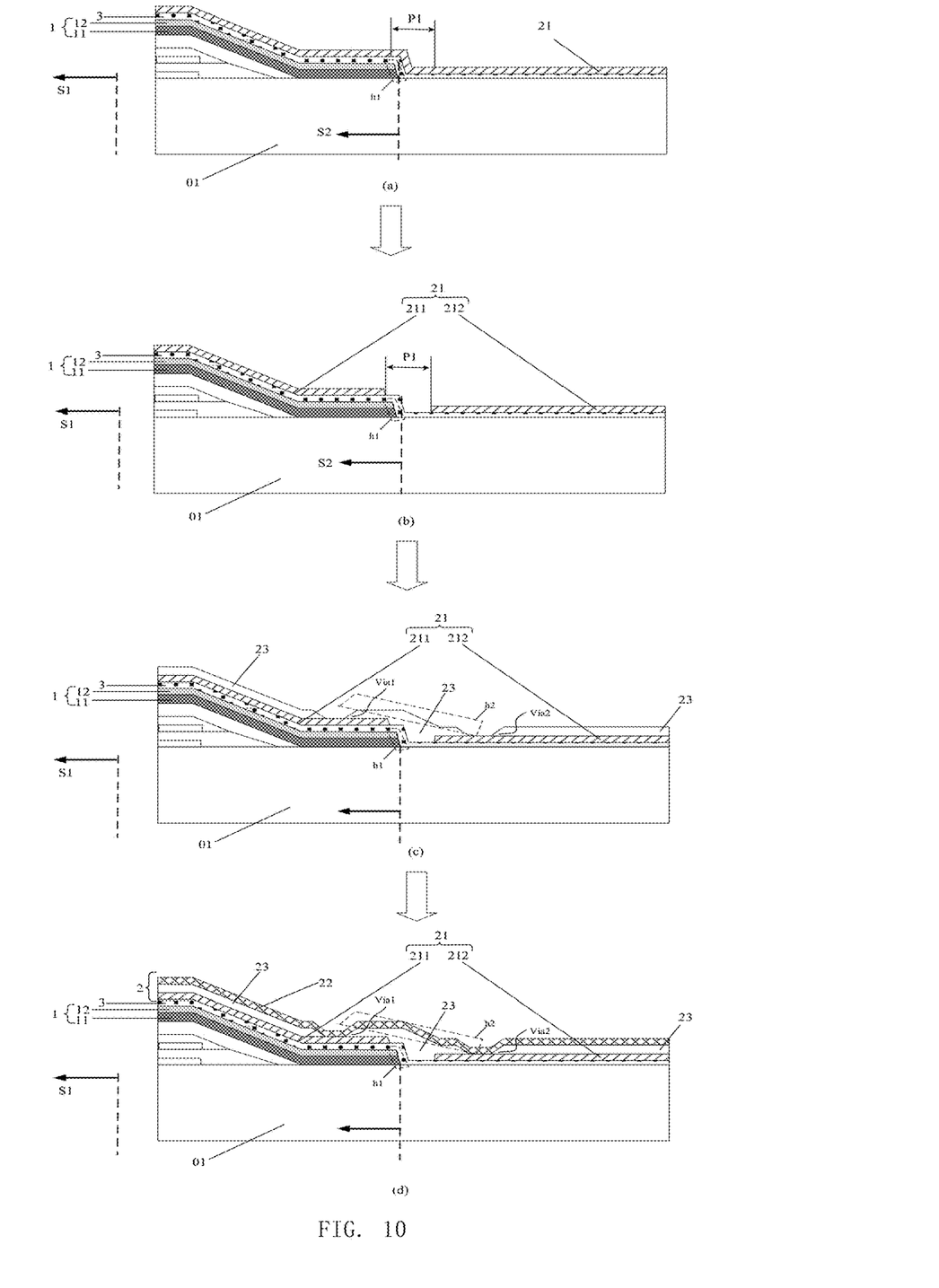
FIG. 10 is a diagram illustrating a process flow for manufacturing touch lines in a method for manufacturing a display panel according to an embodiment of the present disclosure.

In some implementations, as shown by (a) and (b) in FIG. 10, S21 may specifically include S211 and S212.

S211, manufacturing the first lines 21 on a side of the packaging layer 1 away from the substrate 01.

Specifically, as shown by (a) in FIG. 10, a metal layer is formed on a side of the packaging layer 1 away from the substrate 01 by a sputtering process, and then the plurality of first lines 21 extending along the first direction (column direction) are etched by an etching process, where in this step, the extending direction (i.e., the first direction, for example, the column direction) of the first lines 21 crosses the edge of the packaging layer 1 having the first slope h1.

In some implementations, before manufacturing the first lines 21 and after manufacturing the packaging layer 1, the method may further include: manufacturing a second insulating layer 3 on a side of the packaging layer 1 away from the substrate 01. Specifically, a layer of insulating material may be deposited through a CVD process to form the second insulating layer 3, and the second insulating layer 3 covers the packaging layer 1 and the edge of the packaging layer 1 having the first slope h1, so that a shape of the second insulating layer 3 at the edge of the packaging layer 1 having the first slope h1 conforms to a slope surface of the first slope h1. The second insulating layer 3 may serve as a touch substrate of the touch lines 2, the touch lines 2 are formed on the second insulating layer 3, the second insulating layer 3 may be made of an inorganic material, for example, silicon nitride (SiNx), and a specific method for manufacturing the second insulating layer 3 is not limited herein.

In some implementations, in the step of manufacturing the first lines 21, a first touch electrode 24 may also be manufactured in a film layer of the display region S2 where the first lines 21 are located.

In FIG. 10, for convenience of description, only the substrate 01 is shown below the packaging layer 1, and in fact, a plurality of layers, such as a gate insulating layer, a first electrode of a light emitting device, and the like, may be further included between the substrate 01 and the packaging layer 1, and may be specifically adjusted according to a layer structure of the display panel, which is not specifically limited herein.

S212, etching away a portion of each first line 21 corresponding to the portion of the packaging layer 1 having the first slope h1, so that the first line 21 is divided into a first part 211 and a second part 212 located at two sides of the first slope h1 respectively, and orthographic projections of the first part 211 and the second part 212 on the substrate 01 do not overlap with an orthographic projection of the portion of the packaging layer 1 having the first slope h1 on the substrate 01.

Specifically, in the process of manufacturing the first lines 21, the plurality of first lines 21 may be obtained through an etching process, and due to the first slope h1 of the packaging layer 1, a height difference between two ends of the first slope h1 is relatively large, etching residues are easily occurred at the first slope h1 so that the material of the first lines 21 may be left in an area between adjacent ones of the first lines 21, short circuits are easily occurred between the adjacent ones of the first lines 21, and a transmission of touch signals is affected. Therefore, the portion of the first line 21 corresponding to the portion of the packaging layer 1 having the first slope h1 (i.e., the portion shown at a position P1 in FIG. 10) is removed by an etching process, so that the first line 21 is broken into the first part 211 and the second part 212 at the first slope h1 of the packaging layer 1, and the first part 211 and the second part 212 of the first line 21 are respectively located at two sides of the first slope h1. Since the first line 21 is disconnected at the first slope h1, it is possible to avoid a short circuit between adjacent ones of the first lines 21 caused by the material of the first line 21 remaining in the area between the adjacent ones of the first lines 21.

S22, as shown by (b) and (c) in FIG. 10, forming a first insulating layer 23 on a side of the first lines 21 away from the substrate 01, where forming the first insulating layer 23 includes forming vias (e.g., a first via Via1 and a second via Via2) in the first insulating layer 23, so that the second lines 22 are electrically coupled to the first lines 21 through the vias in the first insulating layer 23.

Specifically, the first insulating layer 23 is formed on a side of the first lines 21 away from the substrate 01, the first insulating layer 23 covers the first lines 21, and the first via Via1 and the second via Via2 are formed in the first insulating layer 23, where the first via Via1 and the second via Via2 are respectively located on two sides of the first slope h1 of the packaging layer 1, for example, the first part 211 of the first line 21 is electrically coupled to the second line 22 corresponding to the first line 21 through the first via Via1 in the first insulating layer 23, the second part 212 of the first line 21 is electrically coupled to the second line 22 corresponding to the first line 21 through the second via Via2 in the first insulating layer 23, and disconnected parts of the first line 21 are electrically coupled by the second line 22, so that a signal can be transmitted through the first line 21.

In some implementations, as shown by (c) in FIG. 10, in S22, specifically, the manufacturing the first insulating layer 23 on the side of the first lines 21 away from the substrate 01 may further include following S221 and S222.

S221, forming the first insulating layer 23 on the side of the first lines 21 away from the substrate 01.

Specifically, an insulating material is coated on the side of the first lines 21 away from the substrate 01 to form the first insulating layer 23, and the first insulating layer 23 may be an organic insulating layer, which is beneficial to subsequently controlling a gradient of a second slope h2 of the first insulating layer 23 formed at the first slope h1.

S222, forming the second slope h2 at a position of the first insulating layer 23 corresponding to the first slope h1 of the packaging layer 1.

Specifically, the second slope h2 of the first insulating layer 23 may be formed at the position of the first insulating layer 23 corresponding to the first slope h1 of the packaging layer 1, that is, in a region where an orthogonal projection of the first insulating layer 23 on the substrate 01 overlaps an orthogonal projection of the first slope h1 of the packaging layer 1 on the substrate 01, and the gradient of the second slope h2 is smaller than that of the first slope h1, i.e., the second slope h2 is gentler than the first slope h1, and by controlling a physical parameter (for example, viscosity) of the organic material to be coated, fluidity of a material forming the first insulating layer 23 at the first slope h1 may be changed, so that the gradient of the second slope h2 to be formed may be controlled. Compared with the related art that an insulating layer with a slope cannot be formed when the first insulating layer is formed by depositing an inorganic material through a CVD process, the method provided in the embodiment of the present disclosure can effectively control the gradient of the second slope h2 of the first insulating layer 23, and can make the gradient of the second slope h2 small, i.e., the second slope h2 gentle, at the position P1, so that in the subsequent process of manufacturing the second lines 22, when the second lines 22 extend over the second slope h2 of the first insulating layer 23 (i.e., over the first slope h1 of the packaging layer 1), short circuit between adjacent ones of the second lines 22 caused by that the material of the second line 22 remains in an area between the adjacent ones of the second lines 22 due to the first slope h1 being relatively steep can be avoided.

S23, as shown by (c) and (d) in FIG. 10, forming a plurality of second lines 22 on a side of the first insulating layer 23 away from the substrate 01.

Specifically, a metal layer is sputtered on the first insulating layer 23 with the second slope h2, and then the plurality of second lines 22 are obtained through an etching process, so that the first lines 21, the second lines 22 and the first insulating layer 23 form the touch lines 2. In the display region S1, the second lines 22 extend along the first direction (e.g. the column direction) and intersect with the lower edge of the packaging layer 1 having the first slope h1 (as shown in FIG. 1), since the first insulating layer 23 has the second slope h2 at a position thereof corresponding to the first slope h1, and the gradient of the second slope h2 is smaller than that of the first slope h1, it is possible to avoid the second lines 22 from generating etching residue at the first slope h1 to cause the material of the second lines 22 to remain in the area between adjacent ones of the second lines 22 so that a short circuit is caused between the adjacent ones of the second lines 22.

In some implementations, in the step of manufacturing the second lines 22, a second touch electrode 25 may also be manufactured in a film layer of the second lines 22 in the display region S2.

An embodiment of the present disclosure further provides a display device, which includes the display panel described above.

It should be noted that, the display device provided in the embodiment may be any product or component with a display function, such as a mobile phone, a tablet computer, a television, a display, a notebook computer, a digital photo frame, a navigator and the like. The display device may have other essential components that should be understood by those skilled in the art, which are not described herein, and should not be taken as a limitation of the present disclosure.

It will be understood that the above embodiments are merely exemplary embodiments employed to illustrate the principles of the present disclosure, and the present disclosure is not limited thereto. It will be apparent to those skilled in the art that various changes and modifications can be made without departing from the spirit and scope of the present disclosure, and these changes and modifications are to be considered within the scope of the present disclosure.

The invention claimed is:

1. A display panel, comprising:
a substrate;
a packaging layer disposed on the substrate, and an edge of a first side of the packaging layer is provided with a first slope;
touch lines disposed on a side, away from the substrate, of the packaging layer, and an extending direction of at least a portion of the touch lines is crossed with an extending direction of the edge, with the first slope, of the packaging layer;
the touch lines comprise a plurality of first lines, a plurality of second lines and a first insulating layer, the plurality of first lines and the plurality of second lines are respectively disposed on two opposite sides of the first insulating layer, and the plurality of second lines are disposed on a side, away from the substrate, of the first insulating layer,
the second lines are electrically coupled to the first lines through vias in the first insulating layer, and an orthographic projection of at least a portion of the first lines on the substrate is not overlapped with an orthographic projection of a portion of the packaging layer with the first slope on the substrate,
wherein, in the portion of the first lines whose orthographic projection on the substrate does not overlap with the orthographic projection of the portion of the packaging layer having the first slope on the substrate, each of the first lines is divided into a first part and a second part, and the first part and the second part are respectively located on two sides of the first slope;
the first insulating layer has a first via and a second via therein, and the first via and the second via are respectively located on two sides of the first slope, wherein,
the first part is electrically coupled to the second line corresponding thereto through the first via; the second part is electrically coupled to the second line corresponding thereto through the second via.

2. The display panel according to claim 1, wherein a surface of a side of the first insulating layer which is away from the substrate is formed into a second slope at a position corresponding to the first slope, and a gradient of the second slope is smaller than a gradient of the first slope.

3. The display panel according to claim 2, wherein an angle between a slope surface of the second slope and a direction parallel to the substrate is greater than 0° and less than or equal to about 50°.

4. The display panel according to claim 3, wherein an angle between a slope surface of the first slope of the packaging layer and the direction parallel to the substrate is greater than about 50° and less than 90°.

5. The display panel according to claim 1, wherein the first insulating layer is an organic insulating layer.

6. The display panel according to claim 1, further comprising:
a second insulating layer disposed between the packaging layer and the touch lines and covering the edge of the packaging layer with the first slope.

7. The display panel according to claim 1, wherein the packaging layer comprises inorganic layers and an organic layer which are stacked alternatively, wherein an outermost side of the packaging layer proximal to the substrate and an outermost side of the packaging layer proximal to the touch lines are provided with the inorganic layers; a coverage area of the organic layer in the packaging layer is smaller than that of each of the inorganic layers, and edges of first sides of the inorganic layers are stacked to form the first slope.

8. The display panel according to claim 7, wherein organic layers and inorganic layers are stacked alternatively between the outermost side of the packaging layer proximal to the substrate and the outermost side of the packaging layer proximal to the touch lines.

9. The display panel according to claim 1, wherein the packaging layer comprises a first inorganic layer, a first organic layer, and a second inorganic layer; the first inorganic layer and the second inorganic layer are respectively disposed on two opposite sides of the first organic layer, and the second inorganic layer is disposed on a side of the first organic layer away from the substrate; a coverage area of the first organic layer is smaller than that of the first inorganic layer and is also smaller than that of the second inorganic layer, and edges of first sides of the first inorganic layer and the second inorganic layer are stacked to form the first slope.

10. A display device, comprising the display panel according to claim 1.

11. A method for manufacturing a display panel, comprising:
manufacturing a substrate;
manufacturing a packaging layer on the substrate, and forming a first slope on an edge of a first side of the packaging layer;
manufacturing touch lines on a side of the packaging layer away from the substrate, so that an extending direction of at least a portion of the touch lines is crossed with an extending direction of the edge of the packaging layer with the first slope;
the manufacturing the touch lines on the side of the packaging layer away from the substrate comprises:
manufacturing a plurality of first lines, so that an orthographic projection of at least a portion of the first lines on the substrate is not overlapped with an orthographic projection of a portion of the packaging layer with the first slope on the substrate;
manufacturing a first insulating layer on a side of the first lines away from the substrate, including manufacturing vias in the first insulating layer, so that a plurality of second lines to be manufactured are electrically coupled to the first lines through the vias in the first insulating layer;
manufacturing the plurality of second lines on a side of the first insulating layer away from the substrate,
wherein the manufacturing the first lines comprises:
manufacturing the plurality of first lines on the side of the packaging layer away from the substrate;

etching and removing a portion of each first line corresponding to the first slope so as to divide the first line into a first part and a second part which are respectively positioned at two sides of the first slope, wherein orthographic projections of the first part and the second part on the substrate are not overlapped with the orthographic projection of the portion of the packaging layer with the first slope on the substrate.

12. The method according to claim 11, wherein the manufacturing the first insulating layer on the side of the first lines away from the substrate comprises:

forming a second slope at a position of the first insulating layer corresponding to the first slope, wherein a gradient of the second slope is smaller than that of the first slope.

13. The method according to claim 11, wherein the packaging layer comprises inorganic layers and an organic layer that are stacked alternatively, an outermost layer of the packaging layer proximal to the substrate and an outermost layer of the packaging layer proximal to the touch lines are provided with the inorganic layers, a coverage area of the organic layer in the packaging layer is smaller than a coverage area of each of the inorganic layers, and the manufacturing the packaging layer on the substrate comprises:

depositing the inorganic layer on the substrate;

manufacturing the organic layer and inorganic layers which are stacked alternatively on the inorganic layer;

removing a portion of the inorganic layers stacked beyond a preset edge of the packaging layer through a one-time process, so that edges of first sides of the inorganic layers are stacked to form the first slope.

14. The method according to claim 11, wherein the packaging layer comprises a first inorganic layer, a first organic layer, and a second inorganic layer, the first organic layer has a smaller coverage area than the first inorganic layer and the second inorganic layer, and the manufacturing the packaging layer on the substrate comprises:

depositing the first inorganic layer on the substrate;

manufacturing the first organic layer on a side of the first inorganic layer away from the substrate;

depositing the second inorganic layer on a side of the first organic layer away from the substrate;

removing a portion of the first inorganic layer and the second inorganic layer beyond a preset edge of the packaging layer through one-time process, so that edges of first sides of the first inorganic layer and the second inorganic layer are stacked to form the first slope.

\* \* \* \* \*